United States Patent [19]

Takatsu

[11] Patent Number: 5,015,874
[45] Date of Patent: May 14, 1991

[54] STATUS HOLDING CIRCUIT AND LOGIC CIRCUIT USING THE SAME

[75] Inventor: Motomu Takatsu, Hadano, Japan

[73] Assignee: Fujitsu Limited, Kawasaki, Japan

[21] Appl. No.: 457,503

[22] Filed: Dec. 27, 1989

[30] Foreign Application Priority Data

Mar. 20, 1989 [JP] Japan .................................. 1-68329

[51] Int. Cl.$^5$ .................... H03K 17/16; H03K 19/094; H03K 19/21
[52] U.S. Cl. .................. 307/272.1; 307/443; 307/450; 307/454; 307/471; 307/290; 357/12; 357/34; 357/57; 330/257; 330/288
[58] Field of Search ............. 307/443, 450, 454, 471, 307/272.1, 290; 330/257, 288; 357/12, 34, 57

[56] References Cited

U.S. PATENT DOCUMENTS 4,868,418  9/1989  Imamura et al. ................... 357/12

FOREIGN PATENT DOCUMENTS 2335407  5/1974  Fed. Rep. of Germany ...... 307/290
181468   8/1987  Japan .
1334367  8/1987  U.S.S.R. .............................. 307/290

OTHER PUBLICATIONS

T. Futatsugi et al., "A Proposal Resonant-Tunneling for New Functional Devices with High Current Gains", International Electron Devices Mettings, IEDM86, 12/1986, pp. 286-289.

Primary Examiner—Stanley D. Miller
Assistant Examiner—Margaret Rose Wambach
Attorney, Agent, or Firm—Staas & Halsey

[57] ABSTRACT

A status holding circuit includes a transistor having an emitter coupled to a negative power source, a collector and a base coupled to said collector and having a negative conductance range, first and second input terminals to which first and second input signals are applied, a first resistor provided between said first input terminal and the collector of said transistor, a second resistor provided between said second input terminal and the collector of said transistor, and an amplifier provided between a positive power source and said negative power source, for amplifying an output of said transistor drawn from said base thereof to thereby generate an amplified output signal.

25 Claims, 6 Drawing Sheets

STATUS HOLDING CIRCUIT AND LOGIC CIRCUIT USING THE SAME

BACKGROUND OF THE INVENTION

1. Field of the Invention

The present invention generally relates to a status holding circuit and a logic circuit using the same. More particularly, the present invention is directed to a status holding circuit utilizing a hysteresis characteristic and a logic circuit using the same. Further, the present invention relates to a sequential logic circuit called a latch circuit.

2. Description of Related Art

Generally, digital logic circuits are each classified as either a combinational logic circuit or a sequential logic circuit. The output status of a combinational logic circuit is based on only the present input status. On the other hand, the output status of a sequential logic circuit is not based on only the present input status but the present status of the sequential logic circuit as well as the previous input status. Such a sequential logic circuit includes a latch circuit or a flip-flop circuit without exception. A flip-flop circuit can be formed by two latch circuits. From this viewpoint, all types of logic circuits can be configured by only latch circuits and NOR (or NAND) gates. Recently high integration density high-speed LSIs have been demanded. Particularly, there is a trend of an attempt to simplify latch circuits to meet the above-mentioned demand.

Conventionally, normal transistors are used as logic elements for configuring a latch circuit. For example, a D-type latch circuit which is a logic circuit has a D-input and a clock input. An information (data) signal applied to the D-input of the latch circuit is stored therein and then drawn therefrom in synchronism with a clock pulse signal applied to the clock input. A D-type latch circuit based on the transistor-transistor logic (TTL) is formed by a large number of bipolar transistors. A D-type latch circuit based on the emitter-coupled logic (ECL) is formed by at least seven transistors. That is, there is a need for a large number of transistors which configure a latch circuit. Additionally, the use of a large number of transistors prevents high integration and high speeds.

SUMMARY OF THE INVENTION

It is a general object of the present invention to provide a novel and useful status holding circuit in which the aforementioned disadvantages are got rid of.

A more specific object of the present invention to provide a status holding circuit formed by a decreased number of active elements such as transistors.

The above objects of the present invention are achieved by a status holding circuit comprising a transistor having an emitter coupled to a negative power source, a collector and a base coupled to the collector and having a negative conductance range; first and second input terminals to which first and second input signals are applied; a first resistor provided between the first input terminal and the collector of the transistor; a second resistor provided between the second input terminal and the collector of the transistor; and amplifier means provided between a positive power source and the negative power source, for amplifying an output of the transistor drawn from the base thereof to thereby generate an amplified output signal.

Another object of the present invention is to provide a logic circuit using the above-mentioned status holding circuit so that a latch circuit can be configured by a decreased number of active elements.

This object of the present invention is achieved by a logic circuit comprising an exclusive-OR gate having first and second input terminals and an output terminal, a first input signal being applied to the first input terminal; and a status holding circuit coupled to the exclusive-OR gate. The status holding circuit includes a transistor having an emitter coupled to a negative power source, a collector and a base coupled to the collector and having a negative conductance range; a first input terminal coupled to the output terminal of the exclusive-OR gate; a second input terminal to which a second input signal is applied; a first resistor provided between the first input terminal of the status holding circuit and the collector of the transistor; a second resistor provided between the second input terminal of the status holding circuit and the collector of the transistor; and amplifier means provided between a positive power source and the negative power source, for amplifying an output of the transistor drawn from the base thereof to thereby generate an amplified output signal, which is applied to the second input terminal of the exclusive-OR gate.

The above-mentioned object of the present invention is also achieved by a logic circuit comprising an exclusive-OR gate having a first input terminal to which a clock signal is applied, a second input terminal and an output terminal; and a status holding circuit having a first input terminal coupled to the output terminal of the exclusive-OR gate, a second input terminal to which a data signal is applied, and an output terminal coupled to the second input terminal of the exclusive-OR gate, an output signal being drawn from the output terminal of the status holding circuit. The status holding circuit having a hysteresis characteristic. When the clock signal is logic "0", there is no change in the output signal irrespective of the data signal, and when the clock signal is logic "1", the output signal obtained at this time is the same as the data signal.

The aforementioned object of the present invention is also achieved by a logic circuit comprising an exclusive-NOR gate having a first input terminal to which a clock signal is applied, a second input terminal and an output terminal; and a status holding circuit having a first input terminal coupled to the output terminal of the exclusive-NOR gate, a second input terminal to which a data signal is applied, and an output terminal coupled to the second input terminal of the exclusive-NOR gate, an output signal being drawn from the output terminal of the status holding circuit. The status holding circuit having a hysteresis characteristic. When the clock signal is logic "0", there is no change in the output signal irrespective of the data signal, and when the clock signal is logic "1", the output signal obtained at this time is an inverted signal of the data signal.

Additional objects, features and advantages of the present invention will become apparent from the following detailed description when read in conjunction with the accompanying drawings.

DESCRIPTION OF THE PREFERRED EMBODIMENTS

Figure 1:
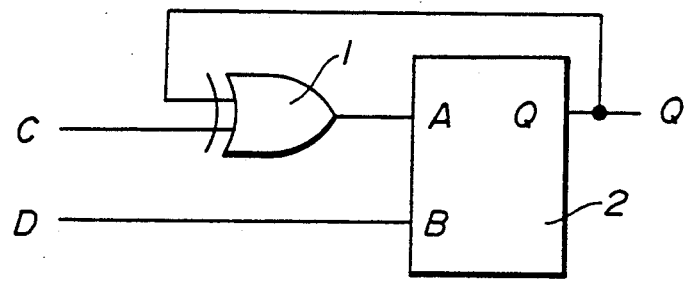
FIG. 1 is a block diagram illustrating the principle of the present invention.

A description is given of the principle of the present invention with reference to FIG. 1.

A logic circuit according to the present invention is made up of an exclusive-OR gate (hereinafter simply referred to as an EX-OR gate) 1 and a status holding circuit 2 which utilizes a hysteresis characteristic. The EX-OR gate 1 outputs logic "1" only when two input signals C and Q are different from each other. The following truth table shows the logic of the EX-OR gate 1.

TABLE 1

| Input | | Output |
|---|---|---|
| C | Q | C ⊕ Q |
| 0 | 0 | 0 |
| 0 | 1 | 1 |
| 1 | 0 | 1 |
| 1 | 1 | 0 |

On the other hand, the status holding circuit 2 outputs logic "0" when two inputs A and B are both "0". When the two inputs A and B are both "1", the status holding circuit 2 outputs logic "1". The status holding circuit 2 holds the previous status when one of the two inputs A and B is "0" and the other input is "1". The following truth table shows the logic of the status holding circuit 2.

TABLE 2

| Input | | Output |
|---|---|---|
| A | B | $Q_{n+1}$ |
| 0 | 0 | 0 |
| 0 | 1 | $Q_n$ |
| 1 | 0 | $Q_n$ |
| 1 | 1 | 1 |

The operation of the logic circuit shown in FIG. 1 is based on the following rules.

(i) When one of the two inputs C and Q of the EX-OR gate 1 is "0", the output thereof is the same as the other input. On the other hand, when one of the two inputs C and Q of the EX-OR gate 1 is "1", the output thereof is opposite to the other input.

(ii) The output Q of the status holding circuit 2 varies only when signals each opposite to the present output Q are supplied to the inputs A and B.

A description is given of the operation of the logic circuit based on the above-mentioned two rules. A case is first considered where a clock input C (corresponding to a clock signal) is "0". In this case, the input A of the status holding circuit 2 is supplied with the same value as the present output Q. Thus, the signal opposite to the present output Q of the status holding circuit 2 is prevented from being applied to the input A thereof irrespective of the value of a data input D (corresponding to a data signal). Thus, there is no change of the output Q.

On the other hand, when the clock input C is "1", the input A of the status holding circuit 2 is supplied with the value opposite to the present output Q through the EX-OR gate 1. Thus, the status of the output Q is inverted when the value of the data input D applied to the input B is opposite to the present output Q. Thus, the output Q has the same value as the data input D.

It can be seen from the above explanation that the logic circuit shown in FIG. 1 passes the data input D as it is when the clock input C is "1" and, on the other hand, holds the output Q when the clock input C is "0". In this manner, the logic circuit shown in FIG. 1 serves as a latch circuit.

A description is given of an embodiment of the present invention with reference to FIGS. 2A through 8.

Figure 2A:
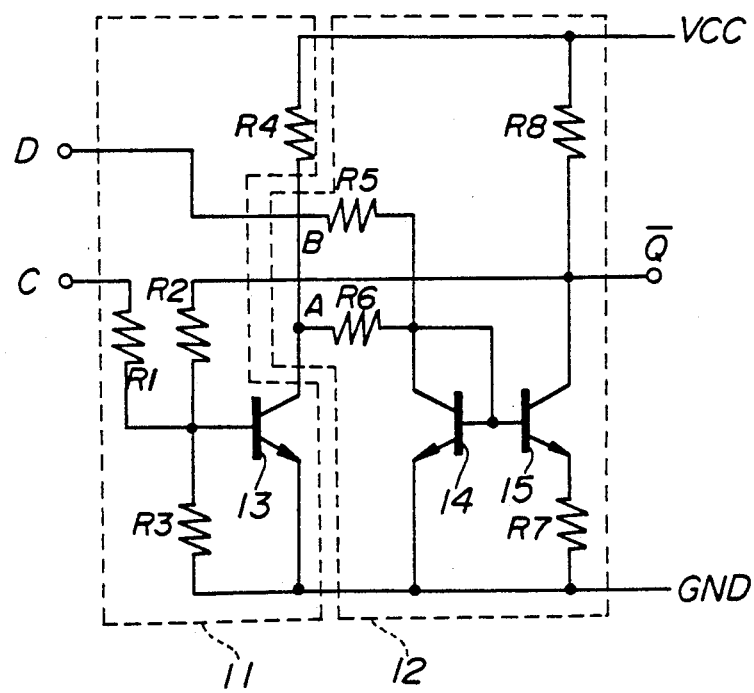
FIG. 2A is a circuit diagram of a logic circuit according to an embodiment of the present invention.
Figure 2B:
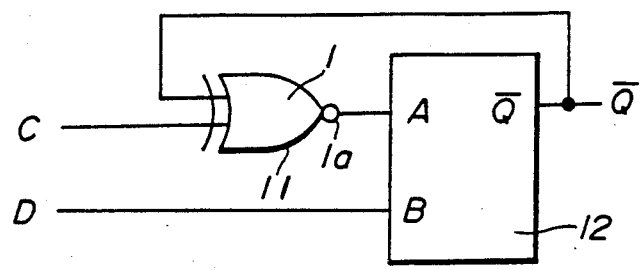
FIG. 2B is a block diagram of the embodiment shown in FIG. 2A.

FIG. 2A is a circuit diagram of an embodiment of the present invention, and FIG. 2B is a logic-level-based diagram of the configuration shown in FIG. 2A. The embodiment is composed of an exclusive-NOR (hereinafter simply referred to as an EX-NOR) gate 11 (composed of the EX-OR 1 and an NOT gate 1a) and a status holding circuit 12. The illustrated embodiment utilizes, as an active element, a resonant-tunneling hot electron transistor (hereinafter simply referred to as an RHET), which has negative conductance and is known as a high-speed active element. The use of negative conductance of the RHET makes it possible to configure both the EX-NOR gate 11 (EX-OR gate 1) and the status holding circuit 2 by an extremely reduced number of transistors. An RHET is disclosed in Japanese Laid-Open Patent Application No. 62-181468, for example.

Figure 2C:
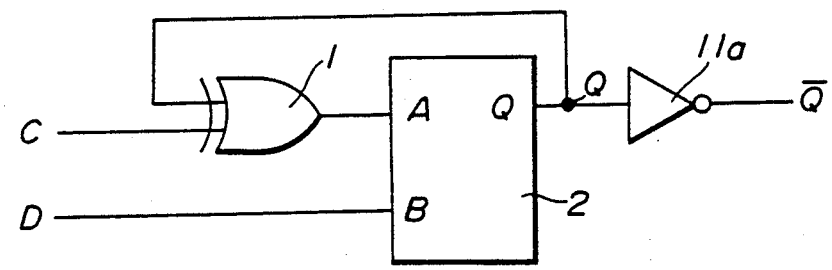
FIG. 2C is a block diagram of an equivalent configuration of the embodiment shown in FIG. 2B.

It is noted that the logic of each of the EX-NOR gate 11 and the status holding circuit 12 shown in FIG. 2 is opposite to that of each of the EX-OR gate 1 and the status holding circuit 2 shown in FIG. 1. Thus, when the clock input C applied to the EX-NOR gate 11 shown in FIG. 2 is "1", the output $\overline{Q}$ is a NOT logic of the data input D, and when the clock input C is "0", the output $\overline{Q}$ is held at it is. The configuration shown in FIG. 2B is equivalent to a circuit shown in FIG. 2C in which a NOT circuit 11a follows the latch circuit shown in FIG. 1.

As shown in FIG. 2A, the EX-NOR gate 11 is made up of an RHET 13 and resistors R1 through R4. It is noted that the illustrated symbol of the RHET 13 is the same as that of a normal bipolar transistor. The resistor R1 is connected between the input terminal C and the base of the RHET 13, and the resistor R2 is connected to the base thereof and an output terminal of the logic circuit. The resistor R3 is connected between the base and emitter of the RHET 13. The resistor R4 is connected to the collector of the RHET 13 and the power source Vcc.

Figure 3:
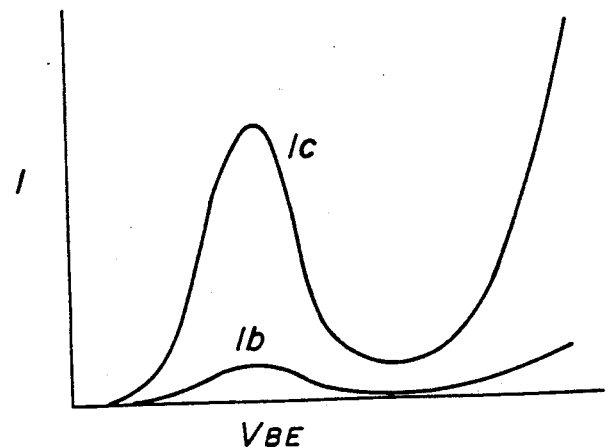
FIG. 3 is a graph illustrating characteristics of a resonant-tunneling hot electron transistor (RHET)
Figure 4:
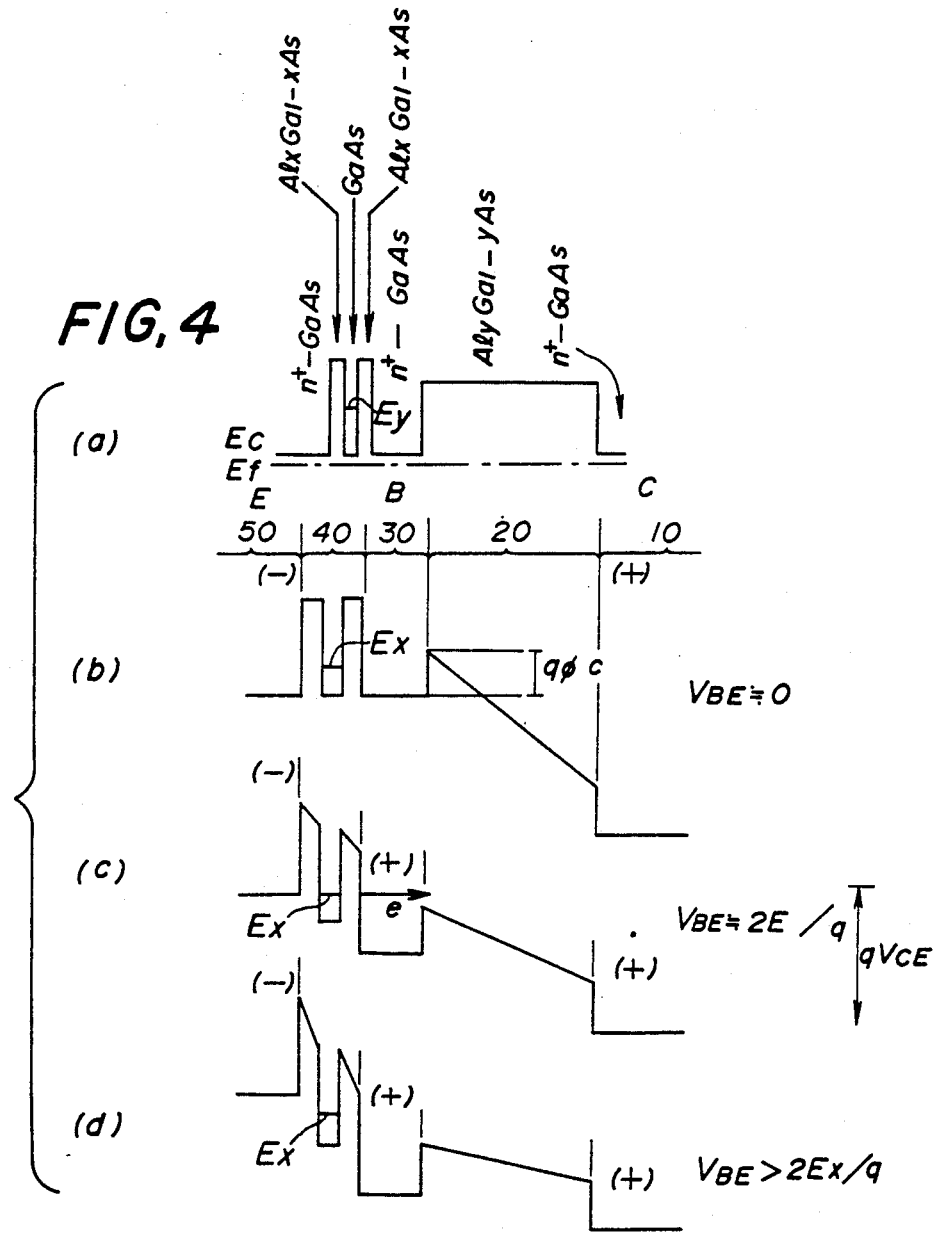
FIG. 4 is a band diagram of RHET.

FIG. 3 is a graph illustrating characteristics of the RHET 13. FIG. 4 is a band diagram of the structure of the RHET 13. The RHET 13 includes a collector layer 10 made of n+-type GaAs (gallium arsenide), a collector barrier layer 20 of AlGaAs (aluminum gallium arsenide), a base layer 30 of n+-type GaAs, an emitter barrier layer 40 having a superlattice structure composed of AlGaAs and GaAs, and an emitter layer 50 of n+-type GaAs. The RHET structure has a band diagram shown in (a) of FIG. 4 in the thermal equilibrium state. A band diagram shown in (b) of FIG. 4 relates to a case where a collector-emitter voltage $V_{CE}$ is applied across the collector 10 and the emitter 50, and the base-emitter voltage $V_{BE}$ applied across the emitter 50 and the collector 10 is approximately zero. When the base-emitter volta $V_{BE}$ is gradually increased and becomes equal to a predetermined voltage, electrons poured into the base 30 from the emitter 50 increase. Electrons poured into the base 30 become hot electrons, which pass through the base 30 at high speeds. During movement of hot electrons in the base 30, some hot electrons are scattered and lose energy. The remaining electrons reach the collector 10. When the base-emitter voltage $V_{BE}$ is further increased, as shown in (d) of FIG. 4, pouring of electrons into the base 30 stop so that the collector current decreases. When the base-emitter voltage $V_{BE}$ is further increased, an increased collector current flows.

The graph of FIG. 3 illustrates the above-mentioned operation. The horizontal axis of FIG. 3 represents the base-emitter voltage $V_{BE}$, and the vertical axis thereof represents the collector current Ic and the base current Ib. It can be seen from the graph of FIG. 3 that the RHET 13 exhibits a negative conductance characteristic.

Figure 5:
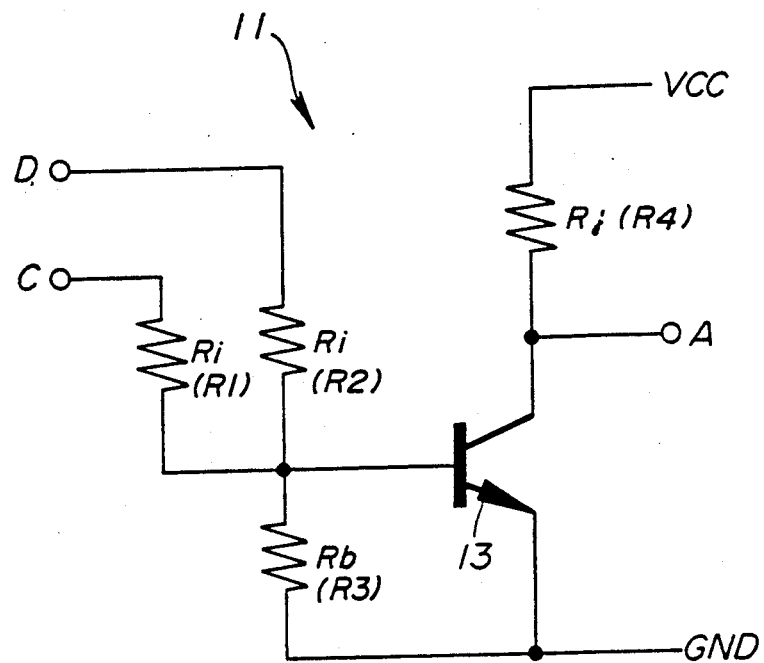
FIG. 5 is a circuit diagram of a configuration of an exclusive-NOR gate shown in FIG. 2B.

FIG. 5 is a circuit diagram of the EX-NOR gate 11 extracted from the configuration shown in FIG. 2A. Resistors Ri, Rb and Rj denote the resistance values of the resistors R1 through R4 shown in FIG. 2A as follows:

R1 = R2 = Ri
R3 = Rb
R4 = Rj

Figure 6:
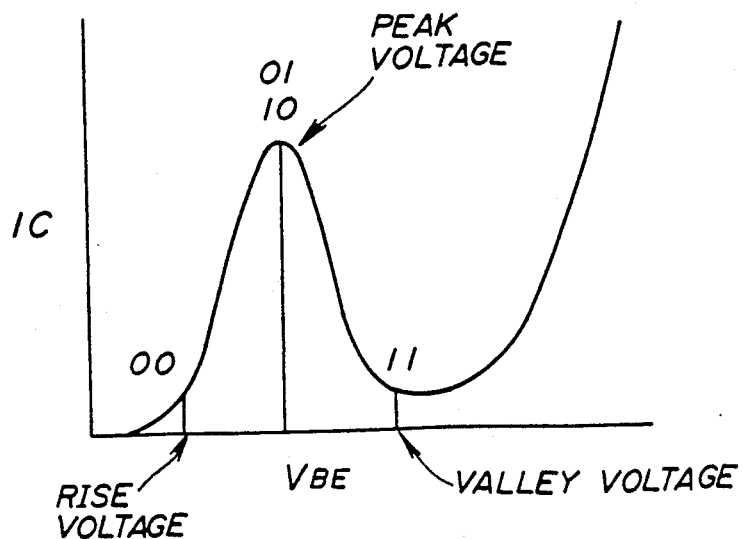
FIG. 6 is a graph illustrating a characteristic of the exclusive-NOR gate.

The resistor R3 has the resistance value Rb smaller than the input resistance of the RHET 13 of the EX-NOR gate 11. Thus, it can be considered that the RHET 13 is voltage-driven. Assuming that the output resistance of a previous stage (as shown) does not change for the sake of simplicity, it may be considered that a voltage applied to the base 30 is generated by dividing half the sum of the voltages applied to the two input voltages C and D by resistance Ri/2 equal to half the resistors R1, R2 (=Ri) and resistance Rb of the resistor R3 connected between the base and ground (GND). As shown in FIG. 6, resistances Ri and Rb are selected so that when the inputs C and D are both "0" the base-emitter voltage $V_{BE}$ is close to a rise voltage, when one of the inputs C and D is "1" and the other input is "0" the base-emitter voltage $V_{BE}$ is close to a peak voltage, and when the inputs C and D are both "1" the base-emitter voltage $V_{BE}$ is close to a valley voltage. Thus, a large collector current Ic passes when one of the inputs C and D is "0" and the other input is "1", whereas less collector current Ic passes in the other cases. Thus, the circuit of FIG. 5 functions as an EX-NOR gate which has NOT logic of EX-OR logic.

Figure 7:
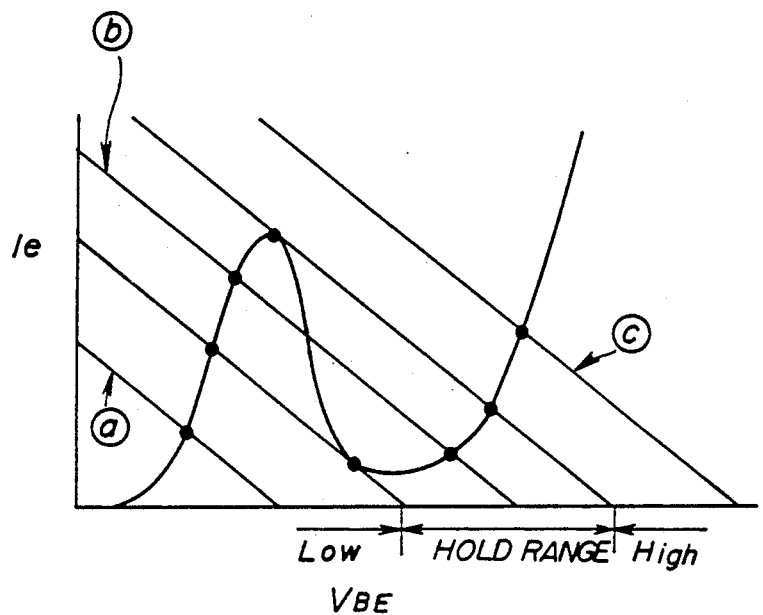
FIG. 7 is a graph illustrating an operation of a status holding circuit.

Turning to FIG. 2A, the status holding circuit 12 is made up of two RHETs 14, 15 and resistors R5 through R8. The RHET 14 functions as a diode having a current-voltage characteristic the same as that shown in FIG. 3 because the base and collector thereof are mutually connected. When applying an input voltage to the diode (RHET 14) through the resistors R5 and R6, the diode exhibits a hysteresis characteristic as shown in FIG. 7. When the input voltage applied across the inputs A and B is low, there is a single cross point between a load line and the curve of the emitter current v. base-emitter voltage characteristic, and there is only a single stable operating point. The load line moves in the right direction of the drawing when increasing the input voltage. Then three cross points between the load line and the curve are obtained and two stable operating points are obtained. In this case, the RHET 14 operates at one of the two stable operating points which is closer to the previous operating point. In other words, the RHET 14 operates one of the two stable operating points at which the smaller input voltage is applied thereto. A hold range illustrated in FIG. 7 has two stable operating points. When the input voltage is further increased, one of the two stable operating points disappears so that the RHET 14 operates at the remaining stable operating point. When the input voltage is decreased from the above-mentioned operating point, the RHET 14 operates in the hold range again in which there are two stable operating points. It is noted that at this time the RHET 14 operates at one of the two stable operating points at which the larger input voltage is applied thereto. When the input voltage is further decreased, one of the two stable operating points which relates to the higher input voltage disappears, and the RHET 14 operates at the remaining stable operating point.

Figure 8:
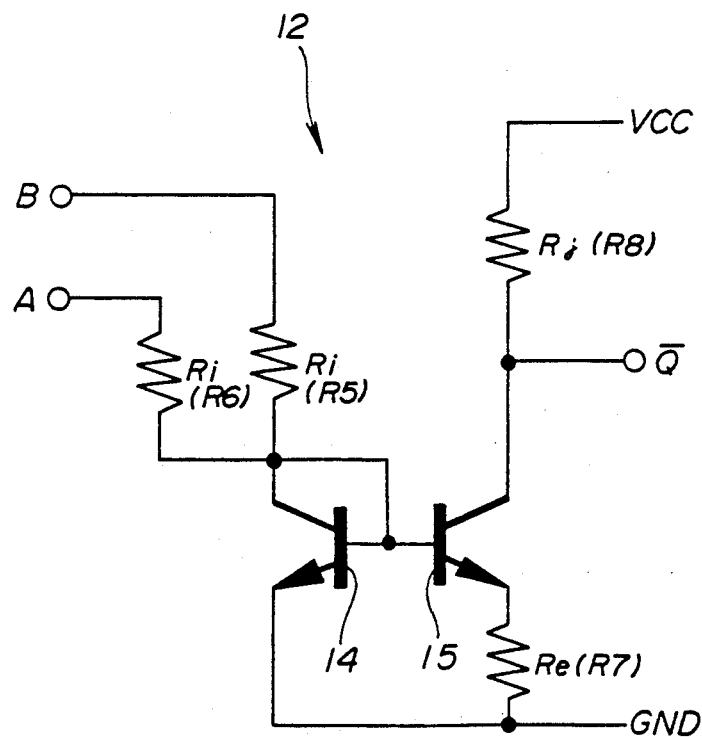
FIG. 8 is a circuit diagram of a configuration of the status holding circuit which operates as shown in FIG. 7.

FIG. 8 is a circuit diagram of the status hold circuit 12 extracted from the configuration shown in FIG. 2A. Resistors Ri, Rb and Rj denote the resistance values of the resistors R1 through R4 shown in FIG. 2A as follows:

R5 = R6 = Ri
R7 = Re
R8 = Rj

The resistor R6 is connected between the input A and the collector and base of the RHET 14, and the resistor R5 is connected between the input terminal B and the collector and base of the RHET 14. The base and collector of the RHET 14 is connected to the base of the RHET 15. The emitter of the RHET 15 is coupled to ground through the resistor R7. The collector of the RHET 15 is coupled to the positive power source Vcc through the output resistor R8. The amplified output signal is drawn from the collector of the RHET 15.

The RHET 14 is supplied with two inputs A and B through resistors Ri. Assuming that there is no change in the output resistance of the previous stage for the sake of simplicity, it is considered that half the sum of the voltage applied to the inputs A and B is applied to the diode (RHET 14) through a resistor having resistance Ri/2. The resistance Ri and the input voltages are selected by referring to FIG. 7 so that when the inputs A and B are both "0" the status holding circuit 12 has a single stable operating point before the voltage peak (load line ⓐ), when one of the two inputs A and B is "0" and the other input is "1" the status operating circuit 12 operates at one of the two stable operating points (load ⓑ), and when the inputs A and B are both "1" the status holding circuit 12 operates a single stable operating point exceeding the valley voltage (load ⓒ). With this arrangement, the base-emitter voltage $V_{BE}$ applied to the diode 14 (base-emitter voltage $V_{BE}$) is lower than the peak voltage when inputs A and B are both "0". When one of the inputs A and B is "0" and the other input is "1", the base-emitter voltage $V_{BE}$ is low if the previous status is 'low', and high if the previous status is 'high'. When the inputs A and B are both "1", the base-emitter voltage $V_{BE}$ is higher than the valley voltage. Thus, the logic status can be held by designing the status holding circuit 12 to operate in the hold range (hysteresis range) shown in FIG. 7 only when one of the inputs A and B is "0" and the other input is "1".

It is noted that a voltage change of the output of the RHET 14 is small. The RHET 15 is used for amplifying a small voltage change derived from the RHET 14. The resistor R7 is provided to have the RHET 15 operate in voltages less than the negative conductance range of the RHET 15. In other words, the resistor R7 causes the RHET 15 to operate in the linear operation range of the collector current v. base-emitter voltage characteristic of the RHET 15.

Figure 9:
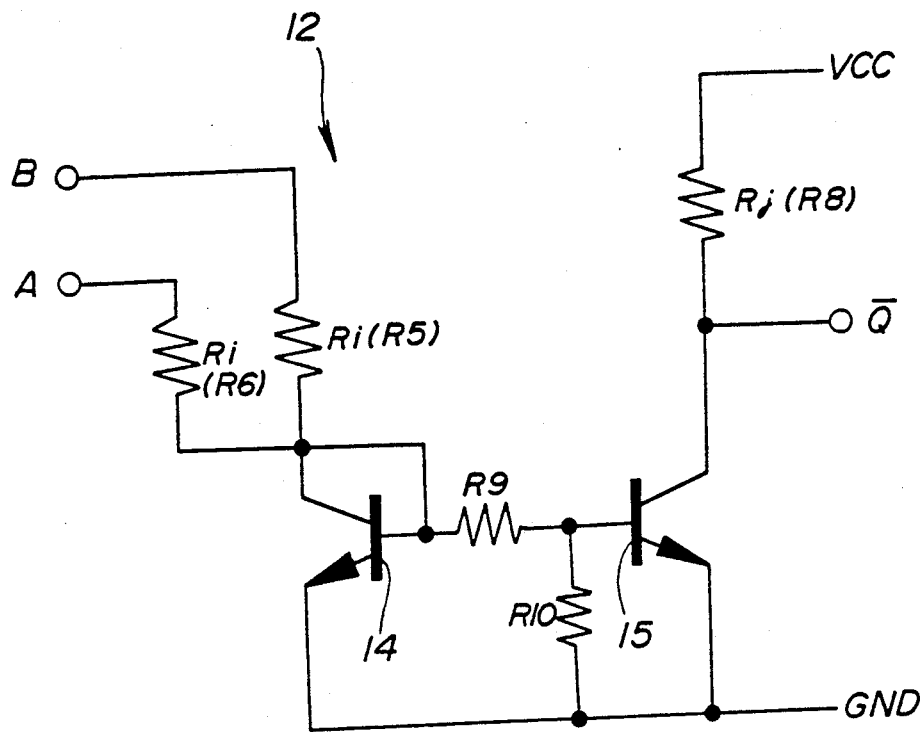
FIG. 9 is a circuit diagram of an alternative configuration of the status holding circuit.

As shown in FIG. 9, resistors R9 and R10 may be used for having the RHET 15 operate in the linear operation range. The base voltage of the RHET 14 is divided by the resistors R9 and R10 so that a divided voltage is generated and applied to the base of the RHET 15. The emitter of the RHET 15 is connected directly to ground.

It is noted that a normal bipolar transistor may be substituted for the RHET 15. However, the use of the RHET 15 will be advantageous to a process of manufacturing the circuit shown in FIG. 2A, because the RHETs 13, 14 and 15 can be formed by the same production process at the same time. In case where a normal bipolar transistor is used in place of the RHET 15, there is a need for a different process of producing the bipolar transistor separately from the production of the RHETs 13 and 14.

Alternatively the RHETs 13, 14 and 15 are replaced with resonant-tunneling bipolar transistors (RBTs). An RBT also has a negative conductance range of a collector current v. base-emitter voltage characteristic (see T. Futatsugi et al., "A RESONANT-TUNNELING BIPOLAR TRANSISTOR (RBT): A PROPOSAL AND DEMONSTRATION FOR NEW FUNCTIONAL DEVICES WITH HIGH CURRENT GAINS", International Electron Devices Meetings, IEDM86, 1986, pp. 286–289, for example).

Figure 10:
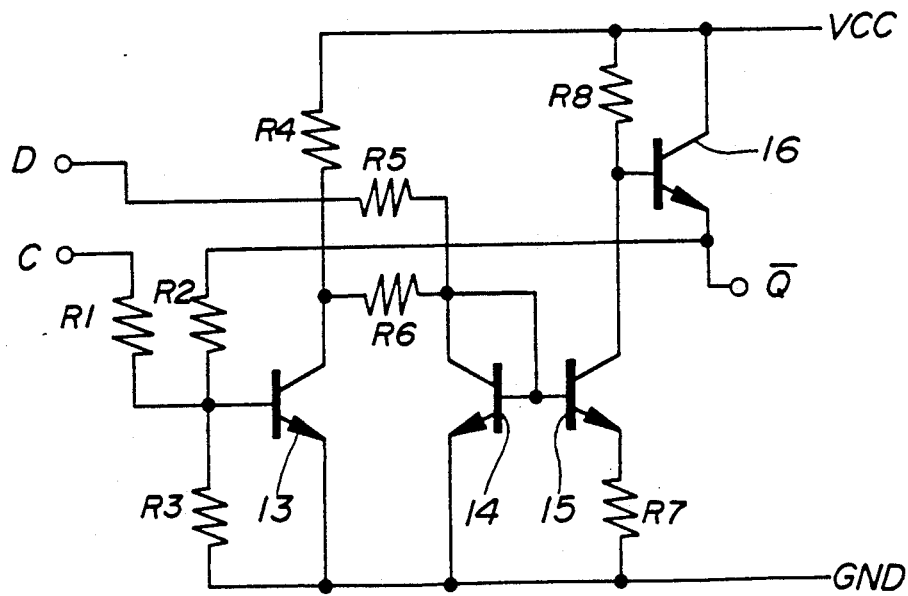
FIG. 10 is a variation of the configuration shown in FIG. 2A.

FIG. 10 is a variation of the embodiment shown in FIG. 2A. In FIG. 10, those parts which are the same as those in FIG. 2A are given the same reference numerals. The output signal of the RHET 15 is drawn through an emitter follower of a transistor 16. The collector of the RHET 15 is connected to the base of the transistor 16. The collector of the transistor R16 is completed to the positive power source Vcc. The output $\overline{Q}$ is drawn from the emitter of the transistor 16, which is connected to an end of the resistor R2. The transistor 16 may be formed by a RHET, a RBT or a bipolar transistor. The transistor 16 increases a driveability of the logic circuit to a load coupled thereto.

The logic circuit according to the present invention can be used for configuring various logic circuits such as a D-type flip-flop, a T-type flip-flop, J-K type flip flop and the like.

The present invention is not limited to the aforementioned embodiments, and variations and modifications may be made without departing from the scope of the present invention.

What is claimed is:

1. A status holding circuit, comprising:
    a status holding transistor having a negative conductance range and having an emitter coupled to a negative power source, a collector and a base coupled to said collector;
    first and second input terminals to which first and second input signals are applied;
    a first resistor provided between said first input terminal and the collector of said transistor;
    a second resistor provided between said second input terminal and the collector of said transistor; and
    amplifier means, provided between a positive power source and the negative power source, for amplifying an output from the base of said status holding transistor to thereby generate an amplified output signal.

2. A status holding circuit as claimed in claim 1, wherein said status holding transistor is a resonant-tunneling hot electron transistor.

3. A status holding circuit as claimed in claim 1, wherein said status holding transistor is a resonant-tunneling bipolar transistor.

4. A status holding circuit as claimed in claim 1, wherein said status holding circuit further comprises:
    an emitter resistor connected to the negative power source, and
    a load resistor connected to the positive power source,
    wherein said amplifier means comprises an amplifying transistor having:
    a base directly connected to the base and the collector of said status holding transistor,
    an emitter coupled to said negative power source through said emitter resistor; and
    a collector coupled to said positive power source through said load resistor, outputting the amplified output signal.

5. A status holding circuit as claimed in claim 1, wherein said status holding circuit further comprises:
    a third resistor connected to the base and the collector of said status holding transistor,
    a fourth resistor connected to the negative power source, and
    a load resistor connected to the positive power source,
    wherein said amplifier means comprises an amplifying transistor having:
    a base connected to the base and the collector of said status holding transistor through said third resistor and coupled to said negative power source through said fourth resistor,
    an emitter directly connected to said negative power source, and
    a collector, coupled to said positive power source through said load resistor, outputting the amplified output signal.

6. A status holding circuit as claimed in claim 5, wherein said amplifying transistor is a transistor selected from a group consisting of a resonant-tunneling hot electron transistor, a resonant-tunneling bipolar transistor and a normal bipolar transistor.

7. A status holding circuit as claimed in claim 5, wherein said status holding transistor is of the same type as said second transistor.

8. A status holding circuit as claimed in claim 1, wherein when the first and second input signals are both logic "0" the amplified output signal is logic "0", and when the first and second input signals are both logic "1", the amplified output signal is logic "1", and when one of the first and second input signals is logic "0" and the other of the first and second input signals is logic "1", the logic status of the amplified output signal obtained is the same as an immediately previous logic status of the amplified output signal.

9. A status holding circuit as claimed in claim 1, further comprising an emitter follower transistor having:
a base coupled to said amplifier means to receive the amplified output signal,
a collector coupled to the positive power source, and
an emitter through which an emitter follower output signal is drawn.

10. A status holding circuit as claimed in claim 1, wherein said first resistor and said second resistor have approximately equal resistances.

11. A logic circuit coupled to positive and negative power sources and receiving first and second input signals, comprising:
an exclusive-OR gate having first and second input terminals and an output terminal, the first input signal being applied to said first input terminal;
a status holding circuit coupled to the output terminal and the second input terminal of said exclusive-OR gate, said status holding circuit including:
a status holding transistor having an emitter coupled to the negative power source, a collector and a base coupled to the collector and producing an output, said status holding transistor having a negative conductance range;
a first input terminal coupled to the output terminal of said exclusive-OR gate;
a second input terminal to which the second input signal is applied;
a first resistor provided between said first input terminal of said status holding circuit and the collector of said status holding transistor; and
a second resistor provided between said second input terminal of said status holding circuit and the collector of said status holding transistor; and
amplifier means, provided between the positive power source and the negative power source, for amplifying the output from the base of said status holding transistor to thereby generate an amplified output signal applied to the second input terminal of said exclusive-OR gate.

12. A logic circuit as claimed in claim 11, further comprising a NOT gate, wherein the first input terminal of said status holding circuit is coupled to the output terminal of said exclusive-OR gate through said NOT gate so that said exclusive-OR gate and said NOT gate form an exclusive-NOR gate.

13. A logic circuit as claimed in claim 12, wherein said logic circuit further comprises:
a third resistor coupled to the first input terminal of said exclusive-OR gate,
a fourth resistor coupled to the negative power source,
a fifth resistor coupled to the negative power source, and
a sixth resistor coupled to said amplifier means,
wherein said exclusive-NOR gate comprises an XOR transistor having:
an emitter coupled to the negative power source,
a base coupled to said sixth resistor to receive the amplified output from said amplifier means therethrough, coupled to the first input terminal of said exclusive-OR gate through said third resistor and coupled to said negative power source through said fourth resistor, and
a collector connected to the first input terminal of said status holding circuit and coupled to the positive power source through said fifth resistor.

14. A logic circuit as claimed in claim 13, wherein said third and sixth resistors of said exclusive-NOR gate have essentially equal resistances.

15. A logic circuit as claimed in claim 13, wherein said XOR and status holding transistors respectively provided in said exclusive-NOR gate and said status holding circuit are resonant-tunneling hot electron resistors.

16. A logic circuit as claimed in claim 13, wherein said XOR and status holding transistors respectively provided in said exclusive-NOR gate and said status holding circuit are resonant-tunneling bipolar resistors.

17. A logic circuit as claimed in claim 13, wherein said third and sixth resistors each have a resistance smaller than an input resistance of said XOR transistor of said exclusive-NOR 18. A logic circuit as claimed in claim 11,
wherein said logic circuit further comprises:
an emitter resistor coupled to the negative power source, and
a load resistor coupled to the positive power source,
wherein said amplifier means comprises an amplifying transistor having,
a base directly connected to the base and collector of said status holding transistor of said status holding circuit,
an emitter coupled to said negative power source through said emitter resistor, and
a collector, coupled to said positive power source through said load resistor, outputting the amplified output signal.

19. A logic circuit as claimed in claim 13,
wherein said logic circuit further comprises:
a seventh resistor connected to the base and the collector of said status holding transistor;
a eighth resistor coupled to the positive power source, and
a load resistor coupled to the positive power source,
wherein said amplifier means comprises an amplification transistor having:
a base connected to the base and the collector of said status holding transistor of said status holding circuit through a seventh resistor and coupled to said negative power source through said eighth resistor,
an emitter directly connected to the negative power source, and
a collector, coupled to the positive power source through said load resistor, outputting the amplified output signal.

20. A status holding circuit as claimed in claim 11, wherein the first input signal is a clock signal and the second input signal is a data signal to be held by said status holding circuit in accordance with the first input signal.

21. A status holding circuit as claimed in claim 20, wherein when the clock signal is logic "0", the amplified output signal is unchanging irrespective of the data signal, and when the clock signal is logic "0", the amplified output signal has the logic state of the data signal.

22. A logic circuit as claimed in claim 11, further comprising an emitter follower transistor having a base coupled to said amplifier means to receive the amplified output signal, a collector coupled to the positive power source, and an emitter through which the amplified output signal is drawn.

23. A logic circuit as claimed in claim 19, wherein said XOR transistor, said status holding transistor and said amplification transistor respectively provided in said exclusive-NOR gate, said status holding circuit and said amplifier means have the same type.

24. A logic circuit receiving clock and data signals, comprising:
    an exclusive-OR gate having a first input terminal receiving the clock signal, a second input terminal and an output terminal; and
    a status holding circuit having a first input terminal coupled to the output terminal of said exclusive-OR gate, a second input terminal receiving the data signal, and an output terminal coupled to the second input terminal of said exclusive-OR gate, an output signal being drawn from the output terminal of said status holding circuit, said status holding circuit having a hysteresis characteristic wherein when the clock signal is logic "0", the logic state of the output signal is unchanging irrespective of the data signal, and when the clock signal is logic "1", the output signal has a logic state identical to the data signal.

25. A logic circuit receiving clock and data signals, comprising:
    an exclusive-NOR gate having a first input terminal receiving the clock signal, a second input terminal and an output terminal; and
    a status holding circuit having a first input terminal coupled to the output terminal of said exclusive-NOR gate, a second input terminal receiving the data signal, and an output terminal coupled to the second input terminal of said exclusive-NOR gate, an output signal being drawn from the output terminal of said status holding circuit, said status holding circuit having a hysteresis characteristic wherein when the clock signal is logic "0", the logic state of the output signal is unchanging irrespective of the data signal, and when the clock signal is logic "1", the output signal has a logic state opposite the data signal.

* * * * *